United States Patent
McNulty

(10) Patent No.: US 7,043,387 B2
(45) Date of Patent: May 9, 2006

(54) TESTING SYSTEM FOR PRINTING PRESS CIRCUIT BOARD CONTROLLERS

(75) Inventor: Alan S. McNulty, New Hyde Park, NY (US)

(73) Assignee: NYT Press Services LLC, Edison, NJ (US)

( * ) Notice: Subject to any disclaimer, the term of this patent is extended or adjusted under 35 U.S.C. 154(b) by 0 days.

(21) Appl. No.: 10/815,671

(22) Filed: Apr. 2, 2004

(65) Prior Publication Data

US 2004/0186677 A1    Sep. 23, 2004

Related U.S. Application Data

(63) Continuation of application No. 10/266,621, filed on Oct. 9, 2002, now Pat. No. 6,760,680.

(51) Int. Cl.
*G01L 25/00* (2006.01)

(52) U.S. Cl. ............... 702/115; 702/117; 702/120; 347/19

(58) Field of Classification Search ............ 702/115, 702/117, 120; 347/19
See application file for complete search history.

(56) References Cited

U.S. PATENT DOCUMENTS

| | | | | |
|---|---|---|---|---|
| 3,764,995 A | * | 10/1973 | Helf et al. | .......... 714/32 |
| 3,774,536 A | * | 11/1973 | Raymond et al. | .......... 101/207 |
| 4,365,334 A | * | 12/1982 | Smith et al. | .......... 714/738 |
| 4,622,647 A | | 11/1986 | Sagnard et al. | |
| 4,686,628 A | | 8/1987 | Lee et al. | |
| 4,763,066 A | | 8/1988 | Yeung et al. | |
| 4,791,357 A | | 12/1988 | Hyduke | |
| 4,965,516 A | | 10/1990 | Parshotam et al. | |
| 5,003,254 A | | 3/1991 | Hunt et al. | |
| 5,027,706 A | * | 7/1991 | Niemiro et al. | .......... 101/366 |
| 5,163,368 A | * | 11/1992 | Pensavecchia et al. | .... 101/136 |
| 5,495,094 A | * | 2/1996 | Rowan et al. | .......... 219/645 |
| 5,537,052 A | | 7/1996 | Wilson et al. | |
| 5,539,305 A | | 7/1996 | Botka | |
| 5,963,889 A | | 10/1999 | Irregger et al. | |
| 6,006,662 A | * | 12/1999 | Ishida et al. | .......... 101/141 |
| 6,038,520 A | | 3/2000 | Schoonover et al. | |
| 6,282,501 B1 | | 8/2001 | Assouad | |
| 6,324,485 B1 | * | 11/2001 | Ellis | .......... 702/117 |
| 6,449,402 B1 | * | 9/2002 | Bettman et al. | .......... 385/15 |

\* cited by examiner

*Primary Examiner*—John Barlow
*Assistant Examiner*—Stephen J. Cherry
(74) *Attorney, Agent, or Firm*—Rothwell, Figg, Ernst & Manbeck

(57) ABSTRACT

Apparatus for testing functionality of a printed circuit board used to control operation of a printing press, including a plurality of input switches for providing to the circuit board test input signals simulating function control signals from a printing press control input, the function control signals controlling a plurality of functions of the printing press; a plurality of test loads simulating printing press loads for receiving from the circuit board output drive signals developed in response to the test input signals; and a processor for controlling operation of the input switches and for monitoring responses of the test loads in response to the output drive signals, whereby proper functionality of the printed circuit board in response to each of the plurality of function control signals is analyzed under simulated conditions of an actual operating printing press.

20 Claims, 14 Drawing Sheets

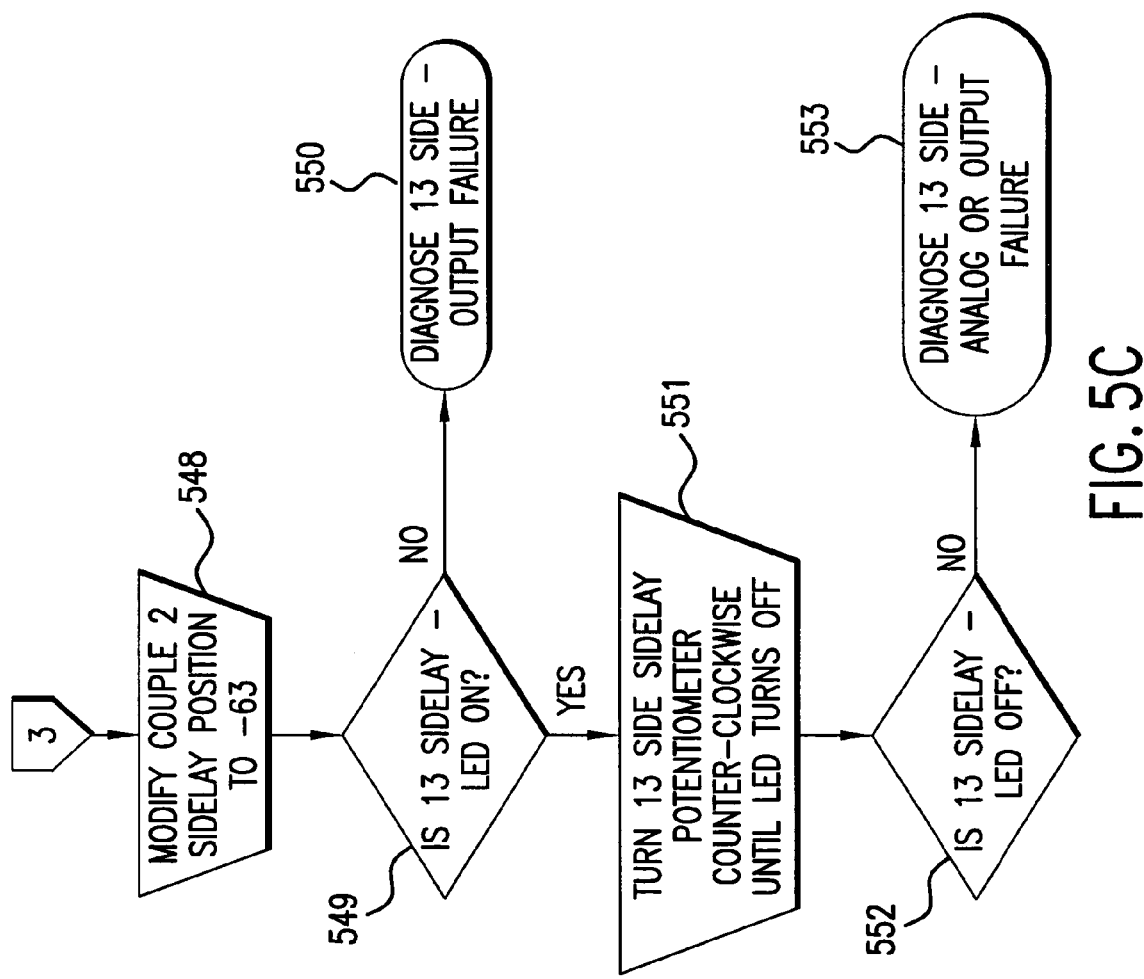

TESTING SYSTEM FOR PRINTING PRESS CIRCUIT BOARD CONTROLLERS

CROSS REFERENCE TO RELATED APPLICATION

This application is a continuation of application Ser. No. 10/266,621, filed Oct. 9, 2002 now U.S. Pat. No. 6,760,680.

BACKGROUND OF THE INVENTION

1. Technical Field

This invention pertains generally to the field of automated testing of electronic circuits. In particular, the invention provides a system for testing the functionality of circuit board controllers that control the operation of printing presses for printing high quality color images in newspapers.

2. Description of the Background Art

Newspaper editors and advertisers rely on modern printing presses to print color images of the highest quality in daily publications such as newspapers. The quality of printed color images is a function of the ability of a printing press to lay down with repeatable precision ink on paper.

In this regard, color registration and maintenance of ink quality are the two most important factors in determining how color image reproduction appears in a publication. In modern printing presses, a Dampening, Registration and Ink ("DRINK") controller subsystem performs these tasks. The DRINK subsystem contains application-specific circuit boards that control basic printing press functions.

As a result of the continuous and intensive nature of the use of newspaper printing presses to produce a daily newspaper publication, color image reproduction quality periodically deteriorates, requiring printing press repair technicians to send out DRINK subsystem circuit boards to outside repair facilities for diagnosis and repair or replacement as a routine procedure in maintaining printing press color image reproduction quality.

However, experience has shown that frequently the circuit boards sent out for diagnosis and repair either do not actually need to be repaired (e.g., where color image quality deterioration is caused by a malfunction other than circuit board failure) or fail to be properly repaired.

While automatic general circuit board testing equipment is known in the art (see U.S. Pat. Nos. 4,965,516, 4,763,066 and 5,003,254 assigned to Huntron Instruments, incorporated herein by reference in their entirety), such equipment provides general diagnostics and individual point-to-point testing of multiple different circuit boards, and thus cannot test specific circuit board under load conditions experienced by the circuit boards. The simple general testing procedures employed by such equipment can lead to reduced circuit board repair success rates.

Application-specific testing of assembled circuits is also known in the art (see U.S. Pat. No. 6,038,520 assigned to ATI Technologies, Inc., incorporated herein by reference in its entirety). However, such testing requires a separate application specific testing entity for each assembled different assembled circuit. U.S. Pat. No. 6,324,485 assigned to New Millenia Solutions, Inc. (also incorporated herein by reference in its entirety) discloses equipment for testing integrated circuit devices in their native environment. However, such equipment requires the use of multiple native devices coupled to a test device in a configuration that recreates a native operating environment of the test device by precise timing control synchronization among the multiple native devices.

There remains a need in the art for a test system for specific DRINK circuit board controllers, wherein the test system is able to simulate actual operating conditions of a running printing press, in order to more accurately and quickly diagnose malfunctions in such circuit board controllers.

SUMMARY OF THE INVENTION

The present invention fulfills the existing need in the art by providing apparatus for testing functionality of a printed circuit board used to control operation of a printing press, including a plurality of input switches for providing to the circuit board test input signals simulating function control signals from a printing press control input, the function control signals controlling a plurality of functions of the printing press; a plurality of test loads simulating printing press loads for receiving from the circuit board output drive signals developed in response to the test input signals; and a processor for controlling operation of the input switches and for monitoring responses of the test loads in response to the output drive signals, whereby proper functionality of the printed circuit board in response to each of the plurality of function control signals is analyzed under simulated conditions of an actual operating printing press.

BRIEF DESCRIPTION OF THE DRAWINGS

FIGS. 5A–5C are flow diagrams of a test procedure for testing DRINK circuit board registration functions according to a preferred embodiment of the present invention;

DETAILED DESCRIPTION OF THE PREFERRED EMBODIMENTS

Figure 6:
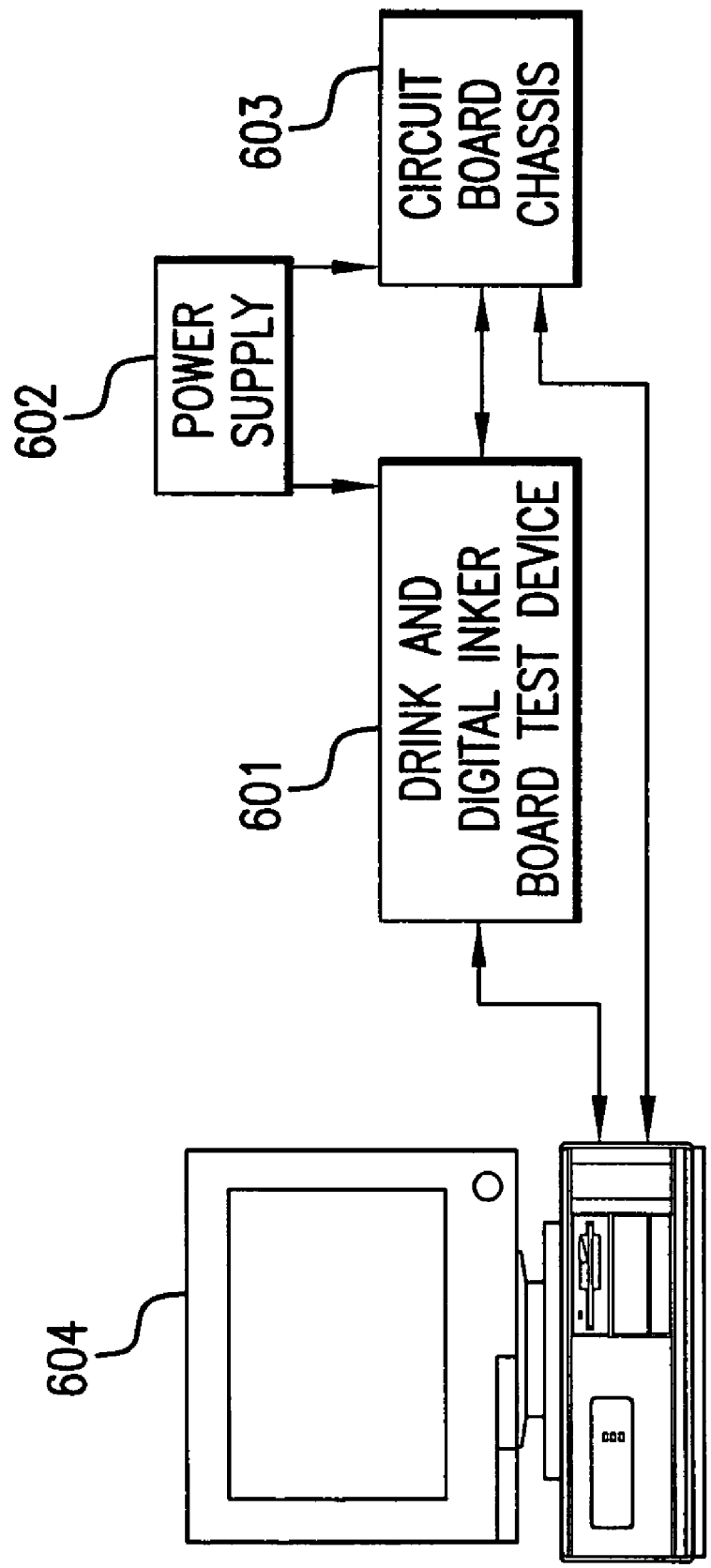
FIG. 6 is a block diagram of a test system according to a preferred embodiment of the present invention using the tester device of FIG. 4 and the procedures of FIGS. 5A–5C.

FIG. 6 is a block diagram of the testing apparatus according one embodiment of the invention. The apparatus includes a DRINK and Digital Inker Board test device 601, a power supply 602, a circuit board chassis 603, and a PC 604.

DRINK and Digital Inker boards are placed into chassis 603, in which they receive simulated printing press control signals from the test device 601 under control of a test program running on the PC 604. Output signals from the boards responsive to the simulated printing press signals are sent to the test device, where they are analyzed for proper operation of the boards. PC 604 is directly connected to the circuit board chassis 603, such that the PC 604 may send and receive signals directly with the chassis 603.

Figure 1:
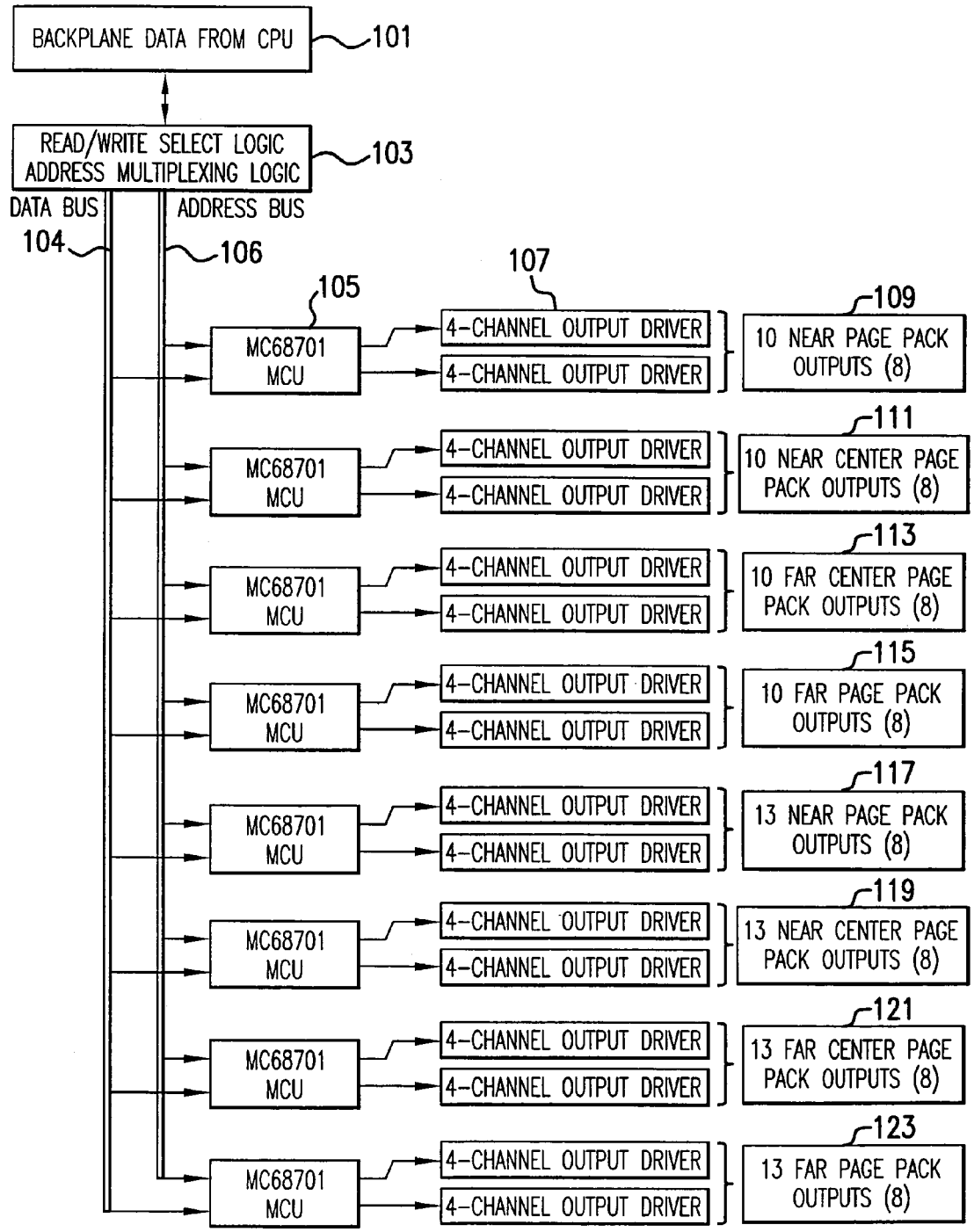
FIG. 1 is a block diagram of a Digital Inker circuit board of a DRINK subsystem to be tested using the present invention.

FIG. 1 is a block diagram of the main components of a digital inker circuit board for use with the test apparatus of the present invention. The digital inker board drives solenoids that meter a measure amount of ink onto an ink pickup roller of the printing press.

Each printed page uses eight columns of ink, which are arranged in a unit called a page pack. The digital inker board receives via a backplane 101 of a central processor (CPU) ink density data for each of the eight columns inputted by an operator using press controls, and writes the data into address multiplexing logic 103. The board also receives eight enable input signals for each of eight defined sections of a page, and two inputs for "color change" functionality.

The digital inker board includes eight microcontroller units (MCU) 105, and 16 4-channel output drivers 107, each MCU receiving address signals and data signals from the multiplexer 103 via data bus 104 and address bus 106, and controlling two output drivers in accordance with the received data signals corresponding to the MCU's address.

A page is divided into what is conventionally known as a "10-side" and a "13-side." Each pair of output drivers respectively drives one of a group of 8 10-side Near Page Pack solenoids 109, 8 10-side Near Center Page Pack solenoids 111, 8 10-side Far Center Page Pack solenoids 113, 8 10-side Far Page Pack solenoids 115, 8 13-side Near Page Pack solenoids 117, 8 13-side Near Center Page Pack solenoids 119, 8 13-side Far Center Page Pack solenoids 121, and 8 13-side Far Page Pack solenoids 123.

The enable signals each enable a pair of 4-channel solenoid output drivers for a page pack. The ink density data signals set the density of ink for each column, which can be set from 0–100% density (the higher the percentage, the longer the solenoid stays energized). The color change signals activate a special function that cycles all ink solenoids at 100% density, which forces a large volume of ink through the page pack to effectively clean out any old ink from the page pack in preparation for an image change.

Figure 2:
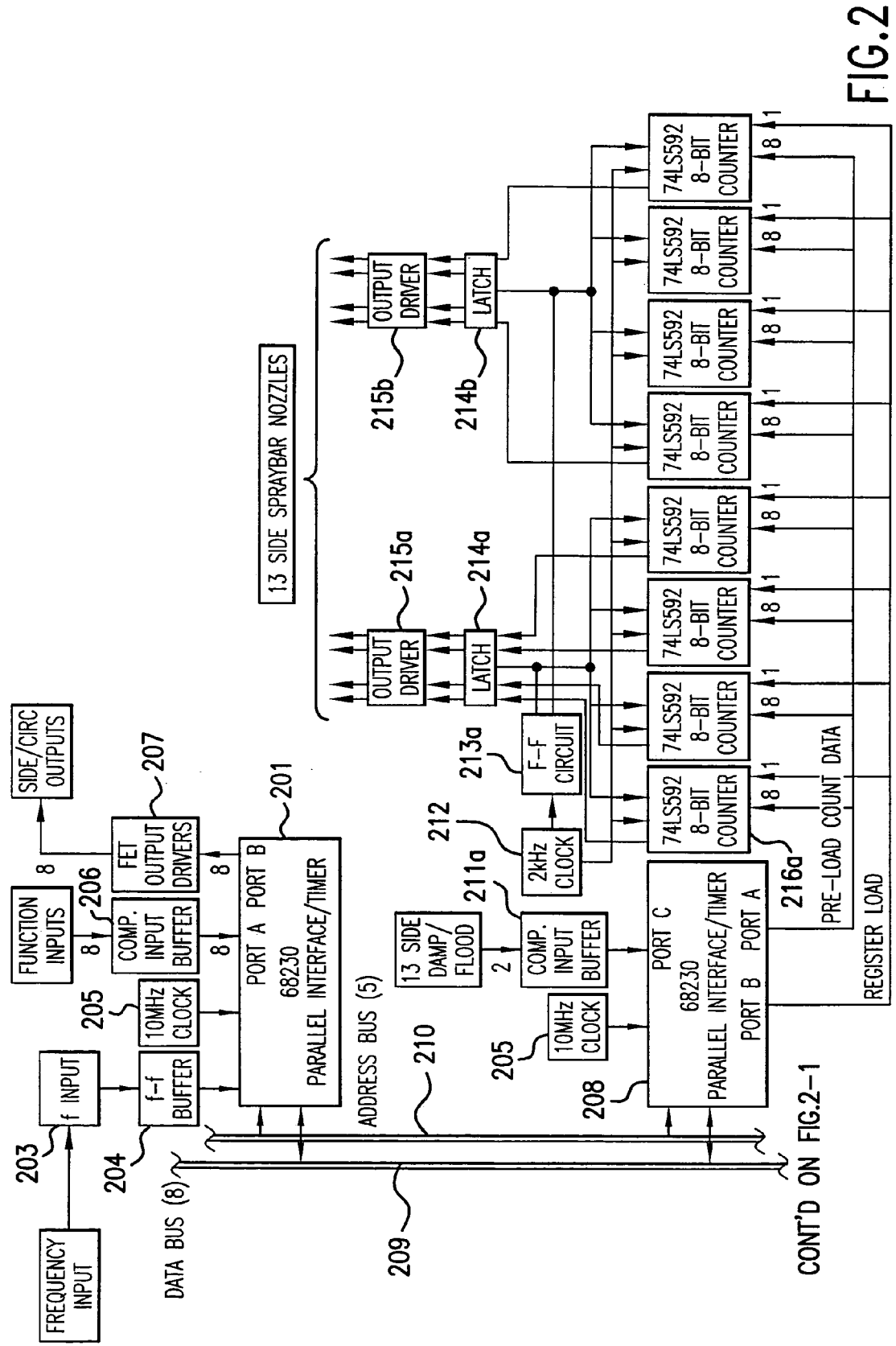
FIG. 2 is a block diagram of a digital input/output section of a DRINK circuit board to be tested using the present invention.
Figures 1, 2:
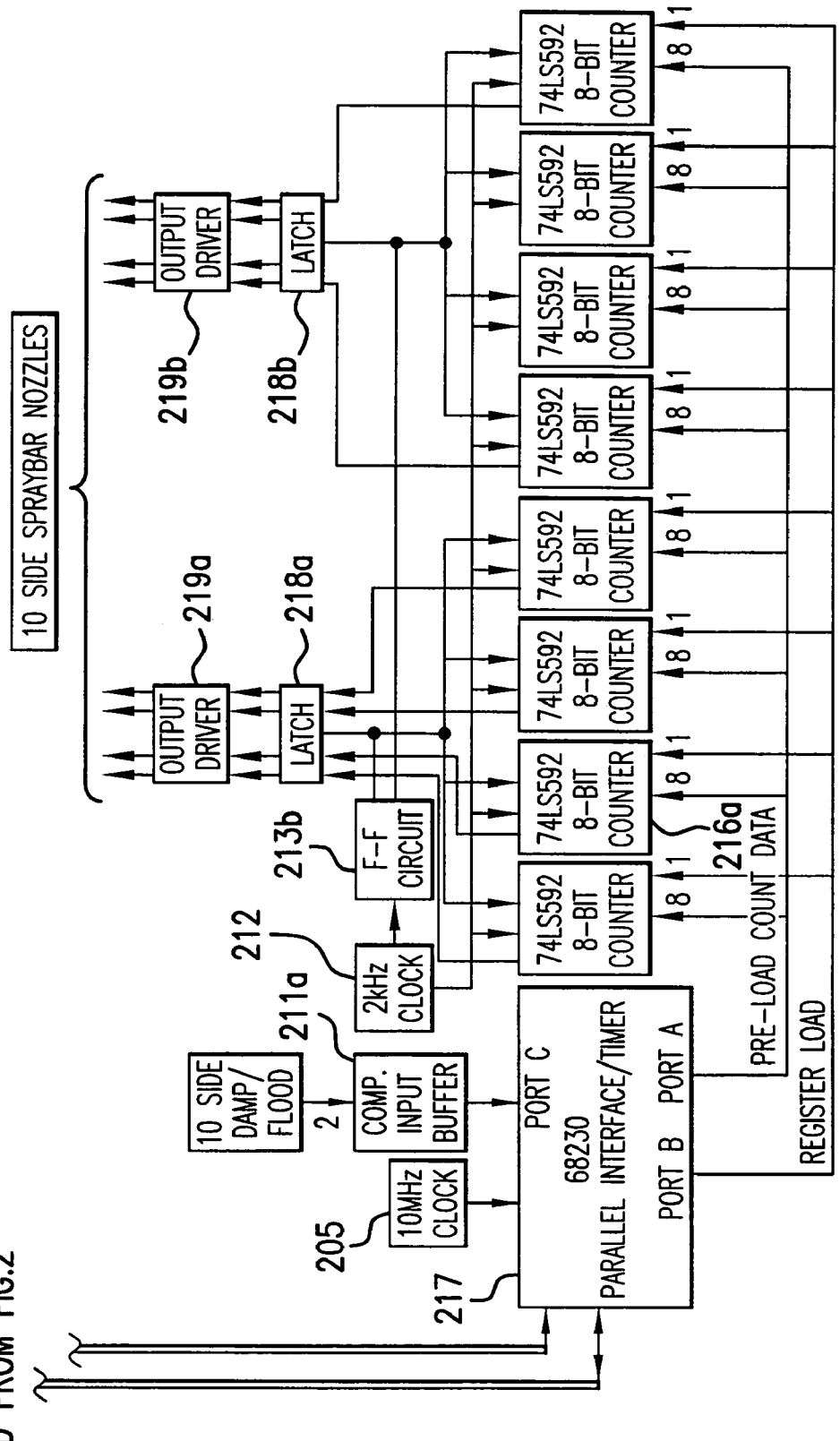

FIG. 2 is a block diagram illustrating the digital input/output components of a DRINK board to be tested by the apparatus of the present invention. The DRINK board controls the operation of two spray bars, each containing eight solenoids. One spray bar is a 10-side spray bar, and the other is a 13-side spray bar. Each spray bar is used to spray a measured quantity of water onto a roller, which determines print quality and ink lay down characteristics. This dampening function is proportional to the operating speed of the printing press. At higher speeds, the spray bar solenoids must fire at a faster rate to maintain the appropriate water density on the page.

Parallel Interface/Timer chip 208 is used to control the 13-side spray bar solenoids, and Parallel Interface/Timer chip 217 is used to control the 10-side spray bar solenoids. Each chip is provided with a 10 MHz clock 105. Dampening Enable and Flood function input signals are provided to respective input buffers 211a and 211b. Control data and address signals are inputted to the timer circuits via data bus 209 and address bus 210. The Interface/Timer chips load count data into 8-bit counters 216a and 216b, which are fed to respective latches 214a, 214b, and 218a, 218b, which in turn feed output drivers 215a, 215b and 219a, 219b. A 2 kHz clock 212 and flip-flop circuits 213a, 213b are provided to synchronize the operation of the counters and the latches. The count data loaded into the counters by the Interface/Timer chips determines the firing rate of the spray bar solenoids and is determined in accordance with a Press Frequency input data signal received on the data bus 209.

The DRINK board also controls color registration or image positioning on the page, and controls the speed of the ink pickup roller. The registration can be moved ±0.063" on the x-axis (called Sidelay Registration), and ±0.127" on the y-axis (called Circumferential Registration). While the volume of ink applied to the roller is determined by the Digital Inker Board, the DRINK board controls the speed of the ink pickup roller, which is determined by and is proportional to the operating speed of the printing press.

A Parallel Interface/Timer chip 201 receives a clock signal from 10 MHz clock 205, a press operating frequency input signal at input register 203 which is buffered in buffer 204, and registration command signals, inputted by an operator, which are inputted to input buffer 206. The registration command signals are used to develop eight control signals that are outputted to FET output drivers 207, which drive eight hydraulic solenoids that control four hydraulic pistons. Each piston controls a respective one of 10-side Sidelay, 10-side Circumferential, 13-side Sidelay, and 13-side Circumferential registration of the press rollers with respect to positioning on the page.

Figure 3:
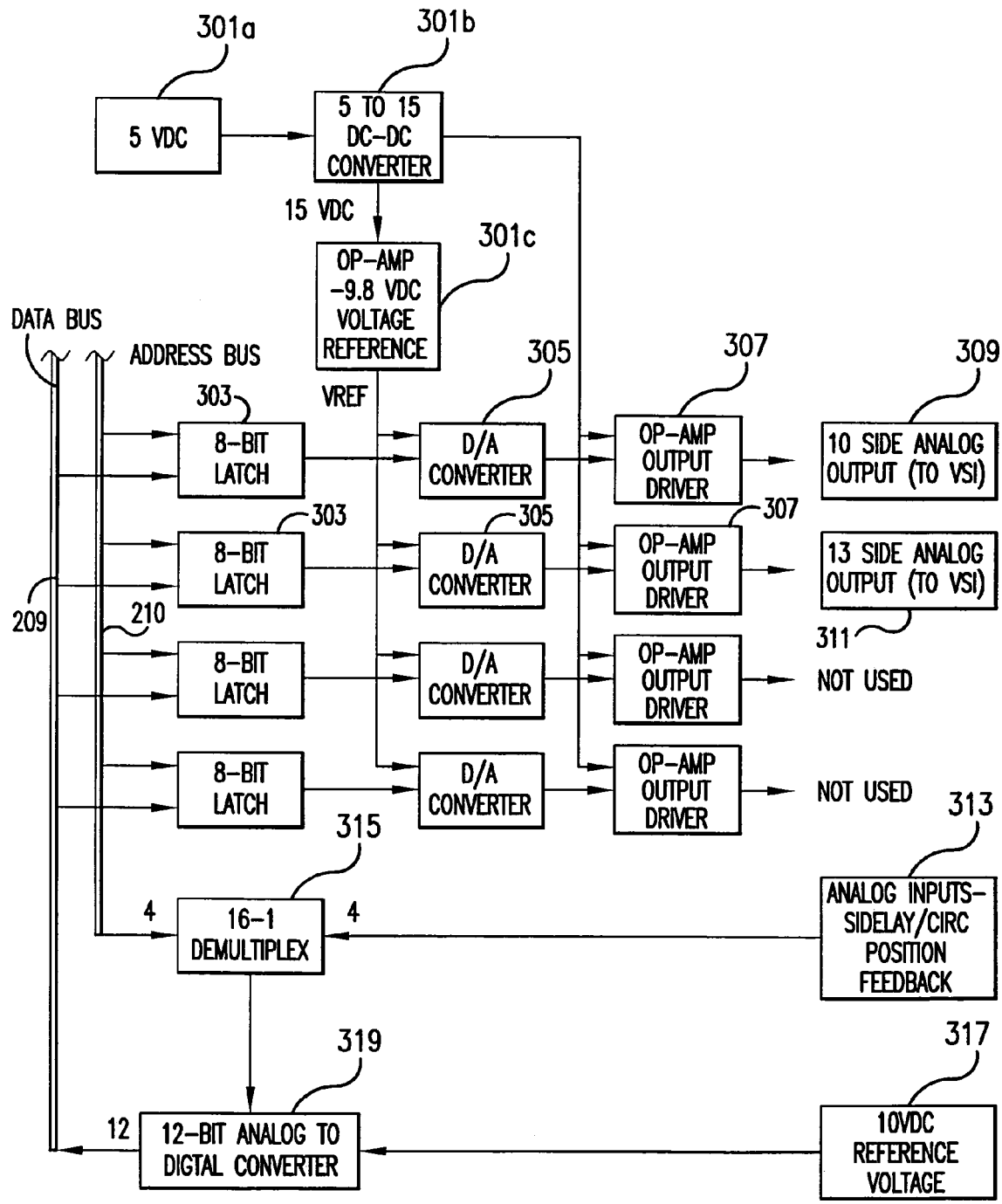
FIG. 3 is a block diagram of an analog input/output section of a DRINK circuit board to be tested using the present invention.

FIG. 3 is a block diagram illustrating the analog input/output components of the DRINK board. A reference voltage Vref is provided to D/A converters 305 by a power supply constituted by a 5 volt source 301a, a DC-DC converter 301b, and a voltage reference operational amplifier 301c. The press operating speed (frequency) input from buffer 204 is used by the Interface/Timer circuit 201 to develop 8-bit signals for the 10-side ink pickup roller and the 13-side ink pickup roller. These 8-bit signals are latched into latches 303 via data bus 209, and converted into analog voltage signals in D/A converters 305. The analog voltage signals are inputted to analog operational-amplifier output drivers 307 to drive 10-side ink pickup roller 309 and 13-side ink pickup roller 311. The analog driving voltage ranges from 0 VDC (at which the roller speed is zero) to 10 VDC (at which the roller speed is maximum). The analog voltage levels are proportional to the operating speed of the press.

Analog Sidelay/Circumferential position feedback transducers 313 provide voltage signals corresponding to the Sidelay and Circumferential registration positions. These feedback position signals are demultiplexed in demultiplexer 315 and converted to digital signals in A/D converter 319. When the desired registration positions indicated by the command signals have been reached as indicated by the voltage feedback position signals, the solenoids are switched off by turning off the FET output drivers 207.

Figure 4:
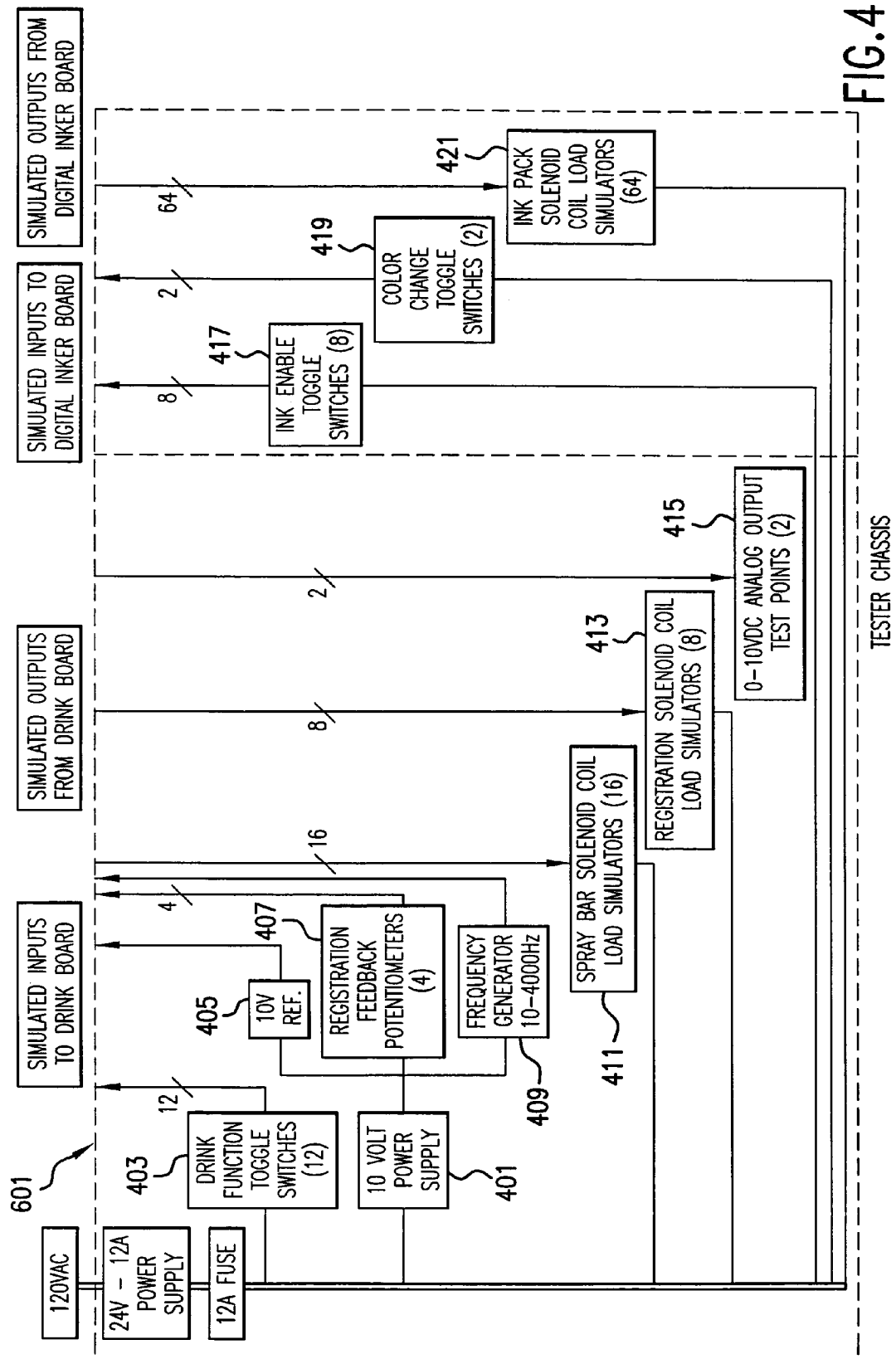
FIG. 4 is a block diagram of a DRINK and Digital Inker circuit board tester device according to one preferred embodiment of the present invention.

FIG. 4 is a block diagram illustrating the main components of the test device 601. A 10 volt power supply 401 receives power from a power source (120 VAC power) via a 24V power supply. 403 represents 12 DRINK function toggle switches, which provide simulated press control signals to the DRINK board Parallel Interface/Timer circuits 201, 208 and 217. A 10V reference voltage signal is provided to A/D converter 319 by reference voltage generator 405, and simulated registration feedback signals are provided to demultiplexer 315 by registration feedback potentiometers 407. A frequency generator 409 provides a simulated press operating frequency to buffer 204.

DRINK board spray bar output driver signals from drivers 215a, 215b and 219a, 219b are provided to spray bar solenoid coil load simulators 411, Sidelay/Circumferential registration output driver signals from FET output drivers 207 are received by registration solenoid coil load simulators 413, 10-side and 13-side analog output driver signals from analog output drivers 307 are received by 0–10 VDC analog output test points 415.

Digital Inker board simulated Ink Enable signals are provided to logic 103 by Ink Enable toggle switches 417, and simulated Color Change signals are provided by Color Change toggle switches 419. Digital Inker board output driver signals from 4-channel output drivers 107 are received by simulated Ink Pack solenoid coil load simulators 421.

Figure 5A:
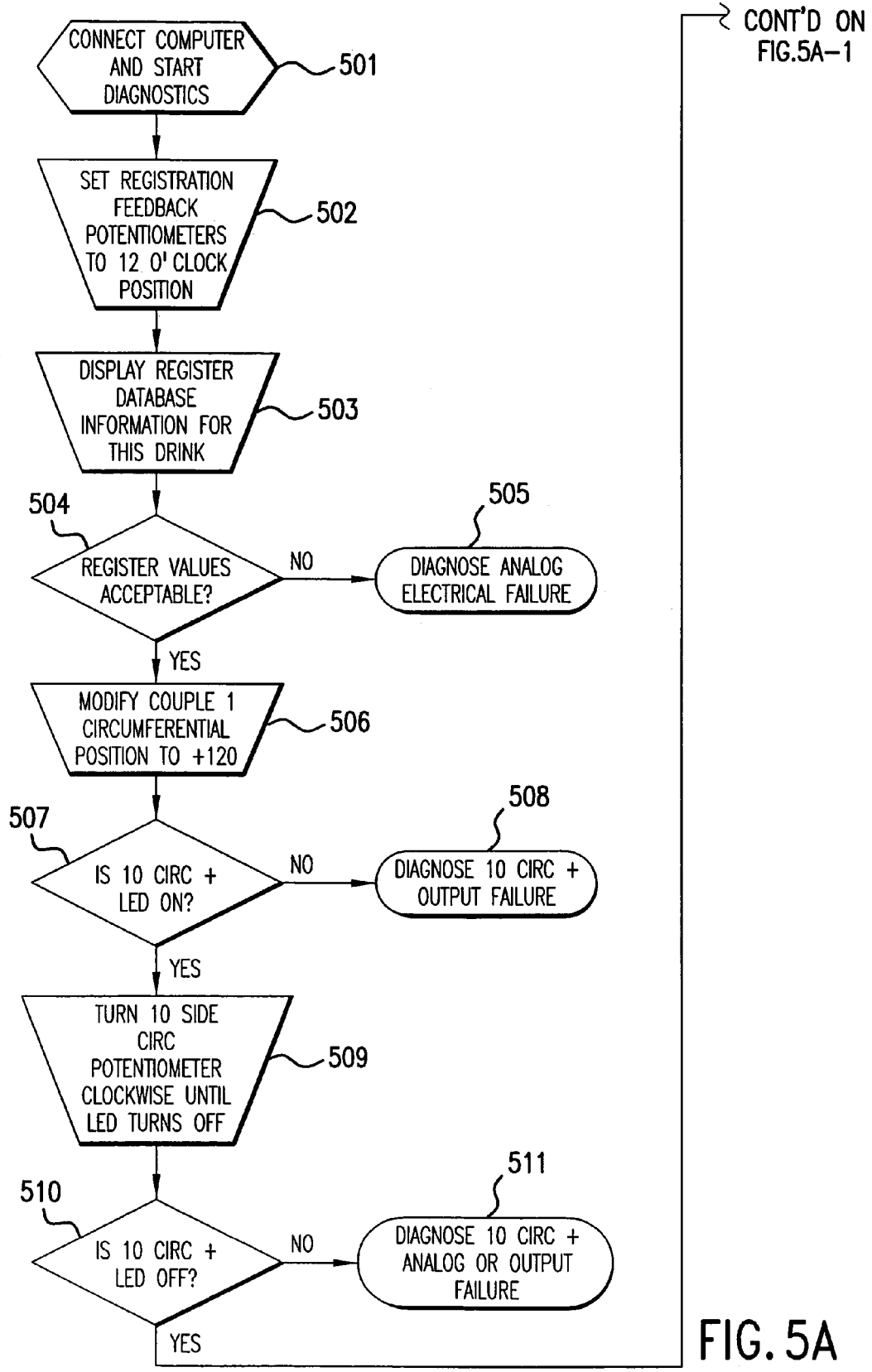
Figures 1, 5A:
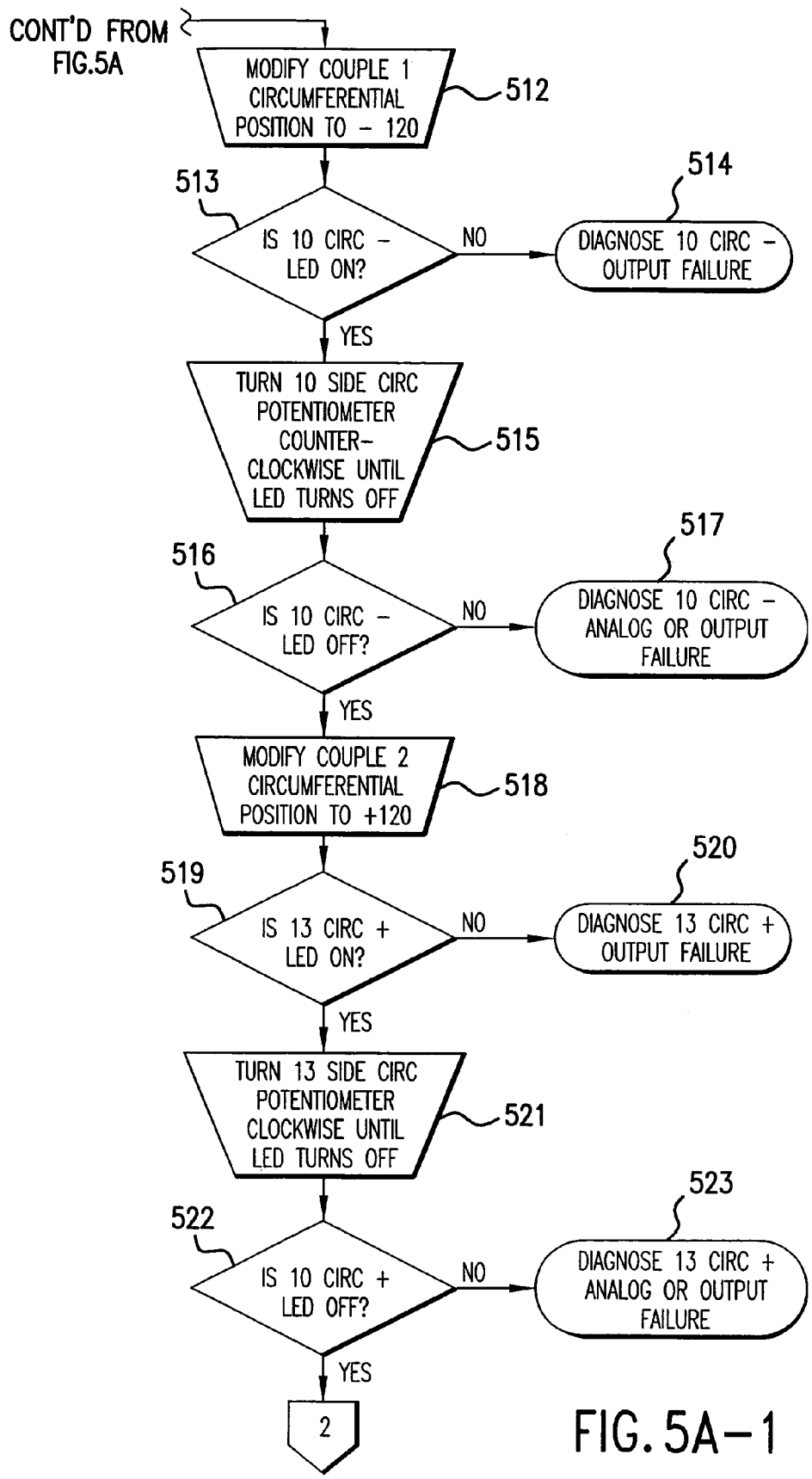
Figure 5B:
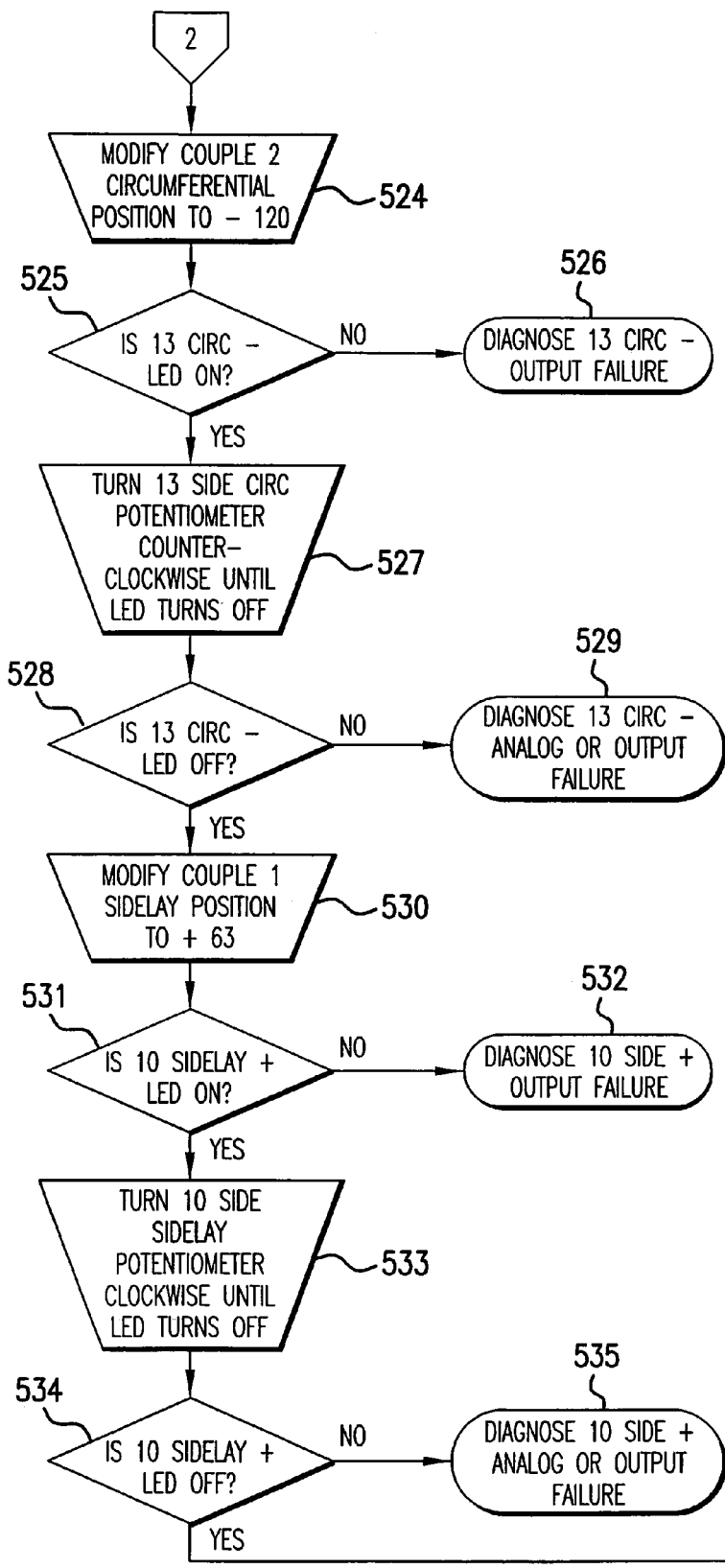
Figures 1, 5B:
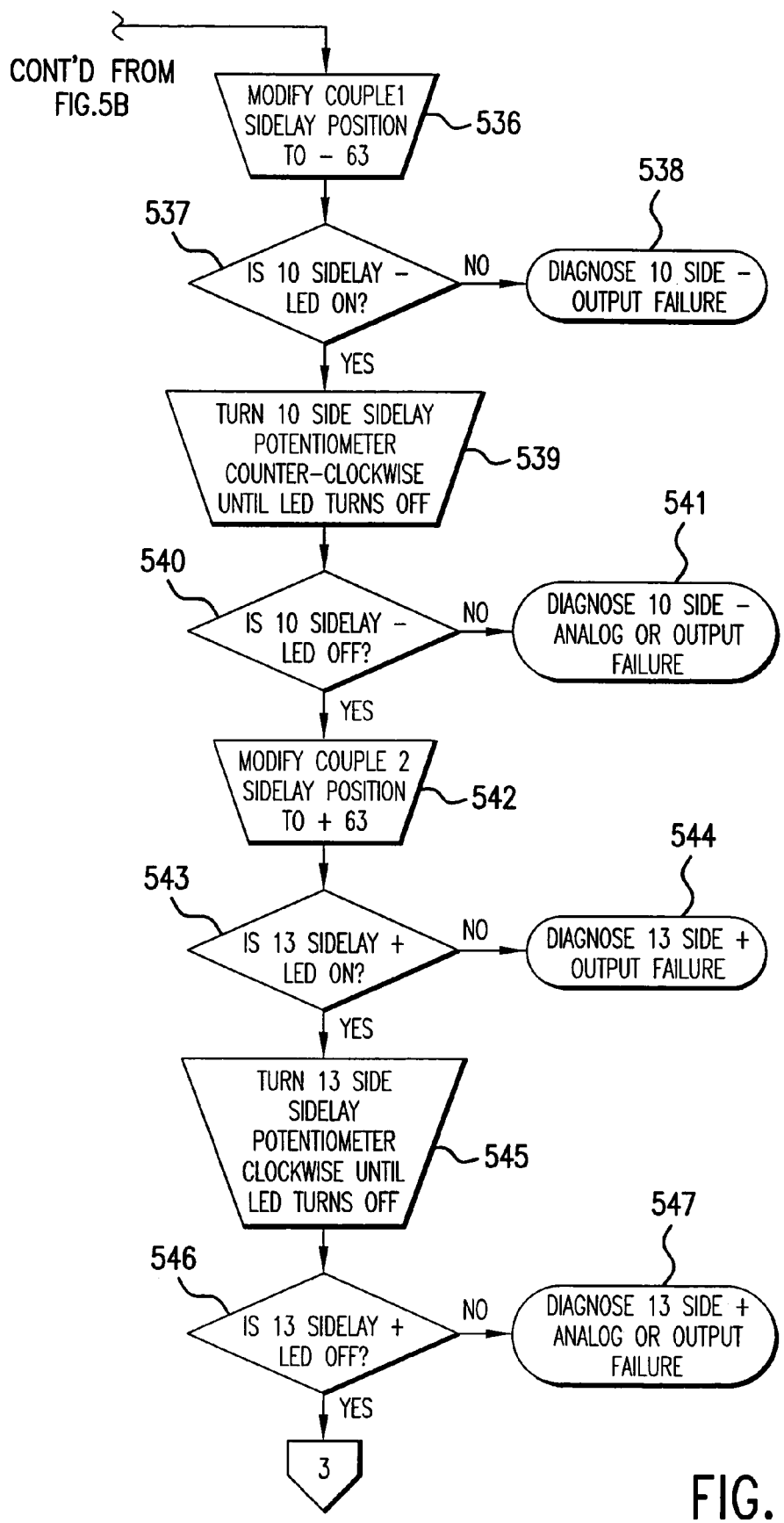

FIGS. 5A–5C are flow diagrams illustrating a test procedure for the registration functions of the DRINK circuit board inserted into chassis 603, as programmed into PC 604.

At step 501, the PC is turned on and the diagnostics program is started. Initially, at step 502, all registration feedback potentiometers 407 are set to the 12 o'clock position. At step 503, the registration position information from the DRINK board A/D converter 319 is displayed. For the 12 o'clock position, the position information displayed should be 0+/−12. At step 504, it is determined whether the displayed position values are acceptable. If the displayed information does not conform to the values that should be displayed, at step 505 an analog electrical failure is diagnosed.

If the position information displayed is correct, then at step 506 the Circumferential Enable toggle switch of toggle switches 403 is turned on, and the position of the 10-side circumferential register is modified to +120, simulating a move of the 10-side circumferential registration 0.120" in the positive direction. At this time, an LED for the 10-side Circumferential positive direction movement should be lighted on the DRINK board. If it is not, at step 509 a failure of the 10-side Circ.+drivers is diagnosed.

If the 10-side Circ.+LED is on, then at step 509 the 10-side Circumferential potentiometer is rotated clockwise until the LED turns off. This should occur at approximately the 3 o'clock position of the potentiometer. At step 510 it is determined whether the LED turned off at the correct position. If not, at step 511 a failure of the 10-side Circumferential+driver 207 or analog feedback circuit is diagnosed.

If the 10-side Circ.+LED has turned off at the proper time, then at step 512 the position of the 10-side Circumferential register is modified to −120, simulating a move of the 10-side circumferential registration 0.120" in the negative direction. Steps 513–517 are analogous to steps 507–511, except that they test for failure of the 10-side Circumferential−driver.

Steps 518–523 are analogous to steps 507–511, except that they test for failure of the 13-side Circumferential+ driver, and steps 524–529 are analogous to steps 513–517, except that they test for failure of the 13-side Circumferential−driver.

Similarly, steps 530–535 are analogous to steps 507–511, except that they test for failure of the 10-side Sidelay+driver, and steps 536–541 test for failure of the 10-side Sidelay− driver. Similarly, steps 542–547 test for failure of the 13-side Sidelay+driver, and steps 548–553 test for failure of the 13-side Sidelay−driver.

Figure 7:
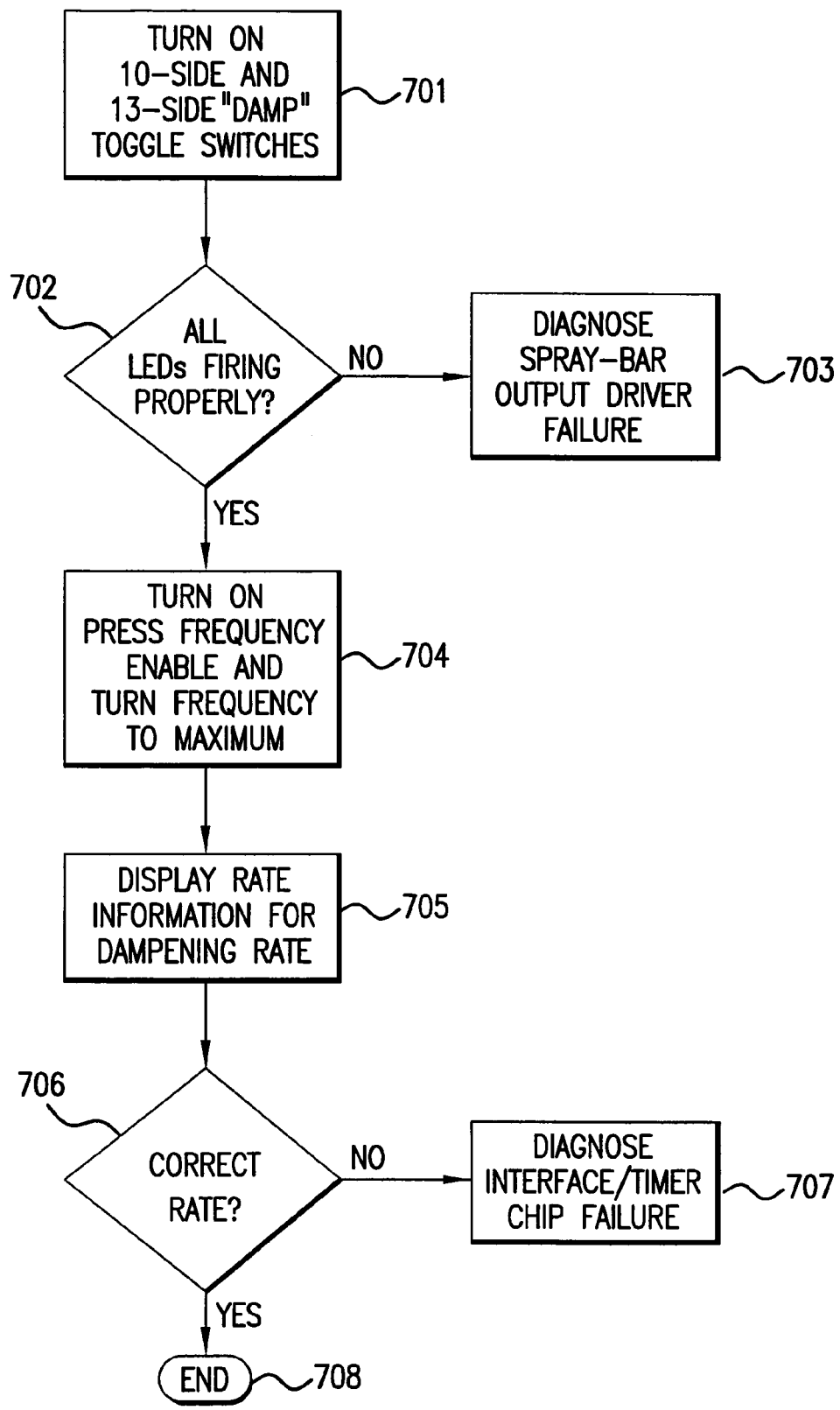
FIG. 7 is a flow diagram of a test procedure for testing DRINK circuit board dampening functions.

The dampening functions are tested as shown in FIG. 7. At step 701, the 10-side and 13-side "Damp" toggle switches 403 are turned on. This operation should cause the DRINK board spray-bar output drivers to output solenoid firing signals (at a rate determined by the setting of the frequency generator 407). At step 702, it is determined whether all of the LEDs corresponding to each output driver are firing properly. If any of the LEDs is not firing, at step 703 the corresponding spray-bar output driver failure is diagnosed. If all LEDs are firing, then at step 704 the Press Frequency Enable toggle switch is turned on and the frequency generator is adjusted to maximum output frequency. At step 705, the rate information for dampening rate is displayed as determined from the output driver signals applied to spray-bar solenoid coil load simulators 411. At step 706 it is determined whether the correct frequency (rate) information is displayed in accordance with the setting of the frequency generator. If not, at step 707 a parallel interface/timer circuit failure is diagnosed. At step 708, the procedure is ended.

Figure 8:
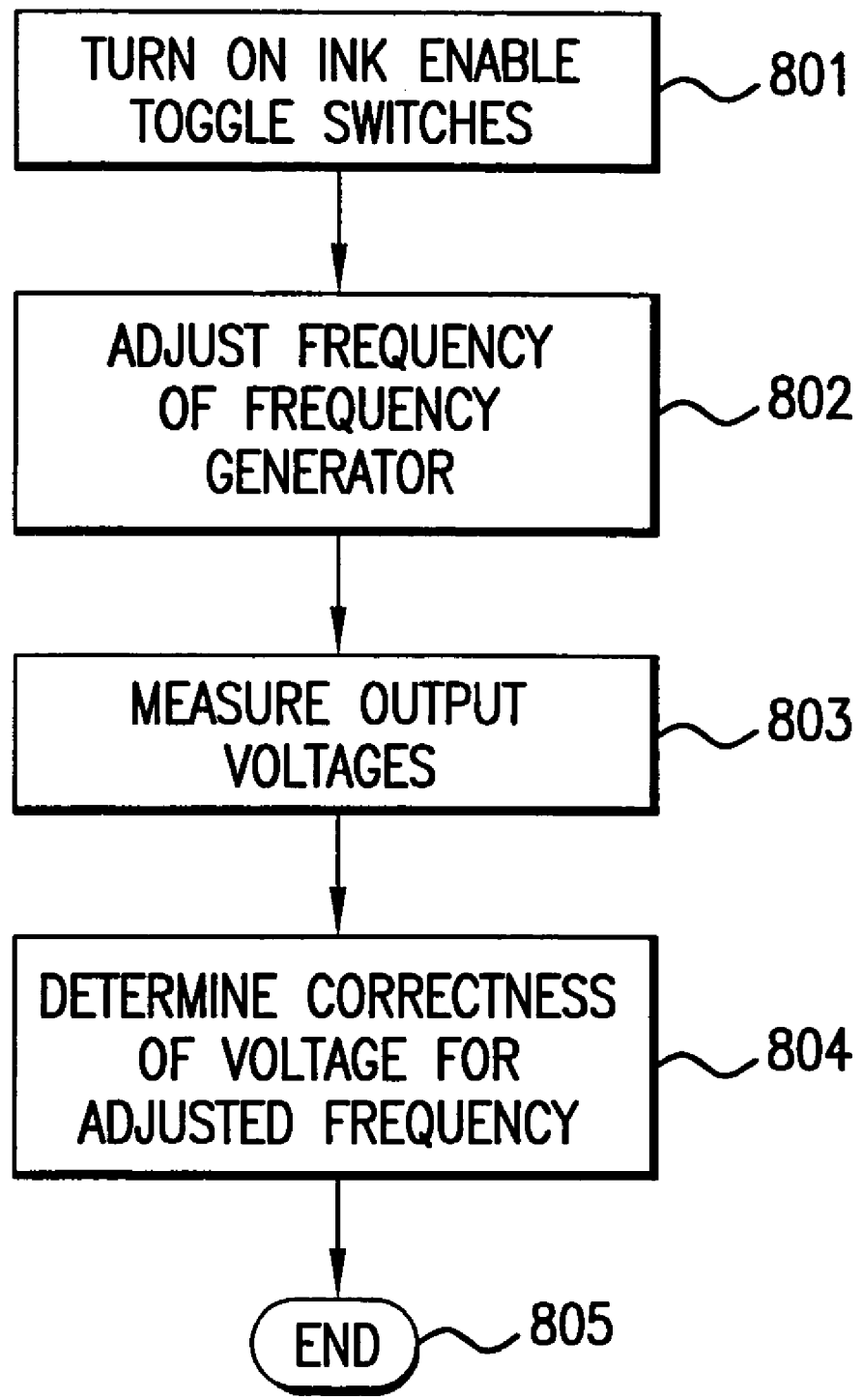
FIG. 8 is a flow diagram of a test procedure for testing DRINK circuit board ink functions.

FIG. 8 is a flow diagram of a test procedure for the Ink functions of the DRINK board. At step 801, the 10-side and 13-side Ink Enable toggle switches 403 are turned on. At step 802 the output of the frequency generator 409 is adjusted to a predetermined frequency (such as to maximum output frequency). At step 803, the analog output voltages from drivers 307 are measured as applied to the analog output test points 415. At step 804, the measured analog output voltages are checked against the frequency being outputted by the frequency generator. If the analog voltages do not properly reflect the inputted frequency, then a failure of the analog output driver circuitry is diagnosed. At step 805, the test procedure then ends.

Figure 9:
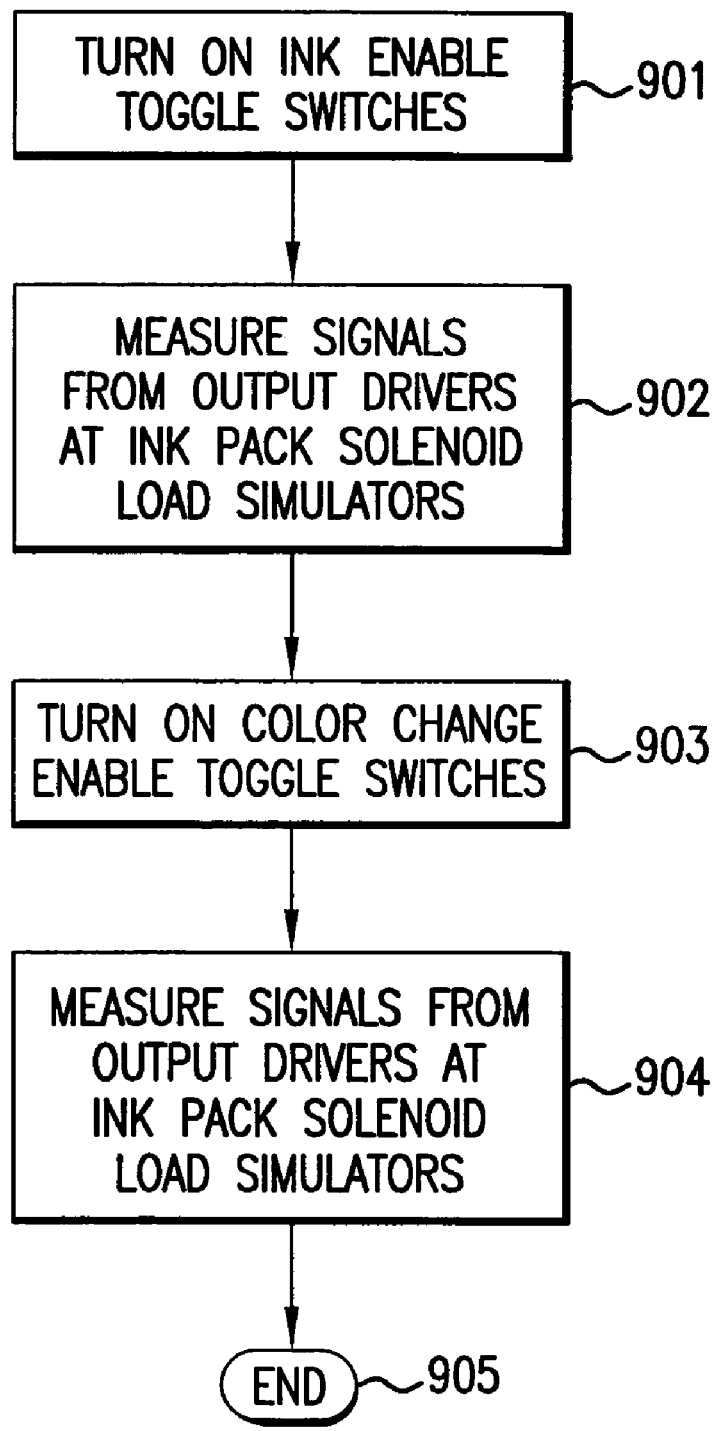
FIG. 9 is a flow diagram of a test procedure for testing Digital Inker circuit board functions.

FIG. 9 is a flow diagram of a test procedure for the Digital Inker board functions. At step 901, the Ink Enable toggle switches 417 are turned on for the 10-side and 13-side page packs. At step 902, output signals from respective the 4-channel output drivers are measured as applied to the Ink Pack Solenoid Coil Load simulators 421 (such as by monitoring corresponding LED indicators). If any of the output drivers fails to generate an output signal, it is diagnosed as a failure.

At step 903, the Color Change Enable toggle switches 419 are turned on and the frequency of frequency generator is adjusted to maximum rate. At step 904 the signals from the 4-channel output drivers are again measured as applied to the solenoid coil load simulators (again observing the corresponding LED indicators on the board) to determine whether the firing rate of the output driver signals is correct for the outputted frequency of the frequency generator. If not, a failure of the corresponding MCU is diagnosed, and at step 905 the procedure ends.

The invention having been thus described, it will be apparent to those skilled in the art that the same may be changed in many ways without departing from the spirit and scope of the invention. Any and all such modifications as would be obvious to those skilled in the art are intended to be encompassed by the following claims.

What is claimed is:

1. A method for testing functionality of a printed circuit board used to control operation of a printing press, comprising:

providing, to the printed circuit board, a plurality of test input signals to simulate printing press control signals, the plurality of test input signals including a function enable signal to enable a printing press function to be controlled by the printed circuit board;

monitoring responses of a plurality of simulated printing press loads driven by a plurality of printed circuit board output signals developed in response to the plurality of test input signals; and analyzing the functionality of the printed circuit board based on the monitored responses of the plurality of simulated printing press loads.

2. The method according to claim 1, wherein the printed circuit board is a digital inker board configured to control:

a volume of ink applied to an ink roller of the printing press for image printing, and a color change volume of ink applied to the ink roller for a color change function.

3. The method according to claim 2, wherein the plurality of test input signals include an ink enable signal to enable a roller inker function of the digital inker board.

4. The method according to claim 2, wherein the plurality of test input signals include a color change enable signal to enable the roller ink color change function of the digital inker board.

5. The method according to claim 2, wherein the plurality of simulated printing press loads include a plurality of ink pack solenoid coil simulated loads.

6. A method for testing functionality of a printed circuit board used to control operation of a printing press, comprising:
providing, to the printed circuit board, a plurality of test input signals to simulate printing press control signals;
monitoring responses of a plurality of simulated printing press loads driven by a plurality of printed circuit board output signals developed in response to the plurality of test input signals; and
analyzing the functionality of the printed circuit board based on the monitored responses of the plurality of simulated printing press loads;
wherein the printed circuit board is a dampening, registration and ink board for controlling printing press roller dampening, roller positional registration and ink roller rotational speed.

7. The method according to claim 6, wherein the plurality of simulated printing press loads include a plurality of spray-bar solenoid coil simulated loads.

8. The method according to claim 6, wherein the plurality of simulated printing press loads include a plurality of registration solenoid coil simulated loads.

9. The method according to claim 6, further comprising:
receiving, from the printed circuit board, a plurality of ink roller rotational speed analog drive signals.

10. A method for testing functionality of a printed circuit board used to control operation of a printing press, comprising:
providing, to the printed circuit board, a plurality of test input signals to simulate printing press control signals, the plurality of test input signals including a frequency signal to simulate a printing press operating frequency;
monitoring responses of a plurality of simulated printing press loads driven by a plurality of printed circuit board output signals developed in response to the plurality of test input signals; and
analyzing the functionality of the printed circuit board based on the monitored responses of the plurality of simulated printing press loads.

11. A machine readable medium storing instructions adapted to be executed by at least one processor to implement a method for testing functionality of a printed circuit board used to control operation of a printing press, the method comprising:
providing, to the printed circuit board, a plurality of test input signals to simulate printing press control signals, the plurality of test input signals including a function enable signal to enable a printing press function to be controlled by the printed circuit board;
monitoring responses of a plurality of simulated printing press loads driven by a plurality of printed circuit board output signals developed in response to the plurality of test input signals; and
analyzing the functionality of the printed circuit board based on the monitored responses of the plurality of simulated printing press loads.

12. The machine readable medium according to claim 11, wherein the printed circuit board is a digital inker board configured to control:
a volume of ink applied to an ink roller of the printing press for image printing, and
a color change volume of ink applied to the ink roller for a color change function.

13. The machine readable medium according to claim 12, wherein the plurality of test input signals include an ink enable signal to enable a roller inker function of the digital inker board.

14. The machine readable medium according to claim 12, wherein the plurality of test input signals include a color change enable signal to enable the roller ink color change function of the digital inker board.

15. The machine readable medium according to claim 12, wherein the plurality of simulated printing press loads include a plurality of ink pack solenoid coil simulated loads.

16. A machine readable medium storing instructions adapted to be executed by at least one processor to implement a method for testing functionality of a printed circuit board used to control operation of a printing press, the method comprising:
providing, to the printed circuit board, a plurality of test input signals to simulate printing press control signals;
monitoring responses of a plurality of simulated printing press loads driven by a plurality of printed circuit board output signals developed in response to the plurality of test input signals; and
analyzing the functionality of the printed circuit board based on the monitored responses of the plurality of simulated printing press loads,
wherein the printed circuit board is a dampening, registration and ink board for controlling printing press roller dampening, roller positional registration and ink roller rotational speed.

17. The machine readable medium according to claim 16, wherein the plurality of simulated printing press loads include a plurality of spray-bar solenoid coil simulated loads.

18. The machine readable medium according to claim 16, wherein the plurality of simulated printing press loads include a plurality of registration solenoid coil simulated loads.

19. The machine readable medium according to claim 16, wherein the method further comprises:
receiving, from the printed circuit board, a plurality of ink roller rotational speed analog drive signals.

20. A machine readable medium storing instructions adapted to be executed by at least one processor to implement a method for testing functionality of a printed circuit board used to control operation of a printing press, the method comprising:
providing, to the printed circuit board, a plurality of test input signals to simulate printing press control signals, the plurality of test input signals including a frequency signal to simulate a printing press operating frequency;
monitoring responses of a plurality of simulated printing press loads driven by a plurality of printed circuit board output signals developed in response to the plurality of test input signals; and
analyzing the functionality of the printed circuit board based on the monitored responses of the plurality of simulated printing press loads.

* * * * *